(12) United States Patent
Kudo et al.

(10) Patent No.: US 7,218,494 B2
(45) Date of Patent: May 15, 2007

(54) OVERLOAD CURRENT PROTECTION DEVICE USING MAGNETIC IMPEDANCE ELEMENT

(75) Inventors: Takahiro Kudo, Kanagawa (JP); Yujiro Kitaide, Kanagawa (JP); Kimitada Ishikawa, Saitama (JP)

(73) Assignee: Fuji Electric Co., Ltd., Kawasaki (JP)

( * ) Notice: Subject to any disclaimer, the term of this patent is extended or adjusted under 35 U.S.C. 154(b) by 366 days.

(21) Appl. No.: 10/468,035

(22) PCT Filed: Feb. 14, 2002

(86) PCT No.: PCT/JP02/01237

§ 371 (c)(1),
(2), (4) Date: Jan. 2, 2004

(87) PCT Pub. No.: WO02/065608

PCT Pub. Date: Aug. 22, 2002

(65) Prior Publication Data

US 2004/0240134 A1   Dec. 2, 2004

(30) Foreign Application Priority Data

Feb. 16, 2001  (JP)  ............................. 2001-040264

(51) Int. Cl.
*H02H 3/08* (2006.01)
(52) U.S. Cl. ........................................ 361/93.1
(58) Field of Classification Search ................ 361/93.1
See application file for complete search history.

(56) References Cited

U.S. PATENT DOCUMENTS

| | | | |
|---|---|---|---|
| 3,851,216 A | 11/1974 | Clarke et al. | ........... 361/31 |
| 4,944,270 A * | 7/1990 | Matsushita et al. | ....... 310/70 R |
| 5,834,940 A | 11/1998 | Brooks et al. | |
| 5,905,357 A * | 5/1999 | Kawasaki | ............... 320/104 |
| 5,933,306 A * | 8/1999 | Santos et al. | ........... 361/45 |
| 5,994,899 A | 11/1999 | Mohri | |
| 6,313,593 B1 * | 11/2001 | Matsubara et al. | ...... 318/434 |
| 6,984,989 B2 * | 1/2006 | Kudo et al. | ............ 324/529 |
| 7,031,131 B2 * | 4/2006 | Kudo et al. | ............ 361/93.1 |

FOREIGN PATENT DOCUMENTS

EP    0 773 449 A2    5/1997

(Continued)

OTHER PUBLICATIONS

U.S. Appl. No. 10/468,045.*

(Continued)

*Primary Examiner*—Burton S. Mullins
*Assistant Examiner*—Ann T. Hoang
(74) *Attorney, Agent, or Firm*—Greer, Burns & Crain, Ltd.

(57) ABSTRACT

An overload current protection device for cutting off power applied from a power supply to a load (3) such as a motor by means of a contactor (switch) (2) at overloading. With the configuration, an element (40) having a magnetic impedance effect as current detection units (4a, 4b, 4c) is used to thereby expand a current detection range by eliminating magnetic saturation due to a core, a problem with a conventional current transformer, thereby providing at low costs an overload current protection device having a wide current detection range.

8 Claims, 14 Drawing Sheets

FOREIGN PATENT DOCUMENTS

| | | |
|---|---|---|
| EP | 0 773449 | 5/1997 |
| EP | 0 930 508 A1 | 7/1999 |
| EP | 930508 | 7/1999 |
| EP | 1 037 056 | 9/2000 |
| EP | 1 037 056 A1 | 9/2000 |
| JP | 48-32857 | 10/1973 |
| JP | 06-176930 | 6/1994 |
| JP | 6-176930 | 6/1994 |
| JP | 06-281712 | 10/1994 |
| JP | 6-281712 | 10/1994 |
| JP | 06-347489 | 12/1994 |
| JP | 6-347489 | 12/1994 |
| JP | 8-75835 | 3/1996 |
| JP | 08-075835 | 3/1996 |
| JP | 08-330645 | 12/1996 |
| JP | 09-080133 | 3/1997 |
| JP | 09-133742 | 5/1997 |
| JP | 10-232259 | 9/1998 |
| JP | 3091398 | 7/2000 |
| JP | 2000-258464 | 9/2000 |
| JP | 3126642 | 11/2000 |
| JP | 2002-6014 | 1/2002 |
| JP | 2002-006014 | 1/2002 |
| JP | 3272423 | 1/2002 |
| WO | WO99/06848 | 2/1999 |

OTHER PUBLICATIONS

U.S. Appl. No. 11/282,716.*

Inada et al; "Quick Response Large Current Sensor Using Amorphous MI element Resonant Multivibrator"; *IEEE Transactions on Magnetics*; Nov. 1994; vol. 30, No. 6, pp. 4623-4625.

Inada, K. et al., "Quick Response Large Current Sensor Using Amorphous MI Element Resonant Multivibrator," IEEE Transactions on Magnetics, vol. 30, No. 6, (Nov. 1994) pp. 4623-4625, INSPEC accession No.: 4860953.

* cited by examiner

OVERLOAD CURRENT PROTECTION DEVICE USING MAGNETIC IMPEDANCE ELEMENT

TECHNICAL FIELD

The present invention relates to an overload current protection device for detecting a current flowing through a conductor, and cutting off the current when the current exceeds a predetermined threshold, for example, an overload current protection device capable of controlling the supply of power to a motor.

BACKGROUND ART

Normally, for example, an overload current protection device of this type detects that the current flowing to a 3-phase motor through a contactor exceeds a safe threshold, and cuts off the current to the motor depending on the detection result, which has been realized by making all or a part the current of the motor flow through a bimetallic element. That is, if a current is applied to the switch made of a bimetal, the bimetal is heated depending on the current magnitude, and the motor current exceeds a safe threshold for a predetermined time, then the bimetal is bent by heat and a switch connection point is set in an OFF state, and the current supply to the control input of the contactor is stopped. However, in the system using the switch, it is difficult to adjust a current when the switch enters the OFF state, and there arises the problem that the system is in the misarrangement state for a long time.

To solve the above-mentioned problem, it has been possible to electronically perform the functions which have conventionally been realized by a bimetallic switch. A reliable and easily adjusted device can be provided using electronic equipment. However, since this electronic system requires a complicated circuit, and a number of parts such as a constant voltage power source, etc. are required to operate a contact system by appropriately detecting a current. Furthermore, a current detection transformer (what is called a CT) is used as current detection unit, which causes the problem that a wide current detection range cannot be obtained because the iron core generates magnetic saturation. There also is a method of using a magnetoresistive element. However, since it has low sensitivity, it requires an iron core, thereby failing in obtaining a wide current detection range as in the case of the above-mentioned CT. Additionally, since the magnetoresistive element has a large fluctuation depending on the temperature and a large difference among the elements, and is subject to an influence of disturbance noise, there occurs the problem that high-precision device means requires a high cost.

Therefore, the present invention aims at providing a low-cost and high-precision overload current protection device capable of expanding a current detection range without a constant voltage power source, etc., and without degradation in precision by an environmental characteristic such as disturbance noise, etc. and a change with time.

DISCLOSURE OF INVENTION

To solve the above-mentioned problems, in one embodiment of the invention an overload current protection device, which has a switch for supplying or cutting off a current from a power source to a load, a current detector for detecting the current, and control power source for applying power to each unit of the device, and cuts off the supply of the current to the load when an overcurrent occurs, configures the current detector by a magnetic impedance element having a magnetic impedance effect, and detects magnetic flux generated by a current using the magnetic impedance element.

In another embodiment of the invention, an overload current protection device, which has a switch for supplying or cutting off a multiphase current from a power source to a load, a plurality of current detectors for detecting the multiphase current for each phase, and a control power source for applying power to each unit of the device, and cuts off the supply of the current to the load when an overcurrent occurs, configures each of the plurality of current detectors by a magnetic impedance element having a magnetic impedance effect, and detects magnetic flux generated by a current using the magnetic impedance element.

One of the embodiments of the invention has wiring for leading the current and a substrate for fixing the wiring, wherein the magnetic impedance element is arranged near the wiring on the substrate so that the magnetic flux generated by a current can be directly detected by a magnetic impedance element.

In another embodiment of the invention, the device further includes: a current applying unit for applying a high frequency current to the magnetic impedance element; a detection unit for detecting an output of the magnetic impedance element; a correction unit for correcting a detection result; a magnetic field applying unit for applying a bias magnetic field to the magnetic impedance element; a magnetic field variable unit for changing a median value of the bias magnetic field; and a control unit for controlling a change of the median value. With the configuration, the median value of the bias magnetic field is changed and the output is detected, and the output can be corrected depending on the detection result.

In an embodiment of the invention, the magnetic field applying unit can be configured by a bias coil and an oscillation unit.

In another embodiment of the invention, the magnetic field variable unit can be configured by an offset coil and a constant current generation unit, or the magnetic field variable unit can be configured by a constant current generation unit, a switch unit, and an addition unit, wherein a constant voltage can be applied to the bias coil.

In yet another embodiment of the invention, two magnetic impedance elements are arranged in the positions in which the absolute values of the output in response to the magnetic flux generated by a current can be equal and the polarity can be opposite to each other, and the current can be detected from the calculation result of the difference between the outputs of the two magnetic impedance elements, or two magnetic impedance elements are arranged in the positions in which the absolute values of the output in response to the magnetic flux generated by a current can be equal and the polarity can be the same, and the current can be detected from the calculation result of the difference between the outputs of the two magnetic impedance elements.

In an embodiment of the invention, a shield for cutting off an external magnetic field can be provided for the wiring for leading the current and the two magnetic impedance elements.

In another embodiment of the invention, the control power source can be configured by a power supply transformer having primary winding inserted in a current supply path from the power source to a load and secondary winding electrically connected to the primary winding, a capacitor for storing the current of the secondary winding of the power supply transformer, and a voltage adjuster.

In yet another embodiment of the invention, the control power source can be configured by a power supply transformer having plural pieces of primary winding, each primary winding for each phase being wound around an iron core, inserted in a current supply path from the power source to a load and secondary winding, a capacitor for storing the current of the secondary winding of the power supply transformer, and a voltage adjuster, and the turns of the primary winding of each phase can be different among the phases.

BEST MODE FOR CARRYING OUT THE INVENTION

Figure 1:
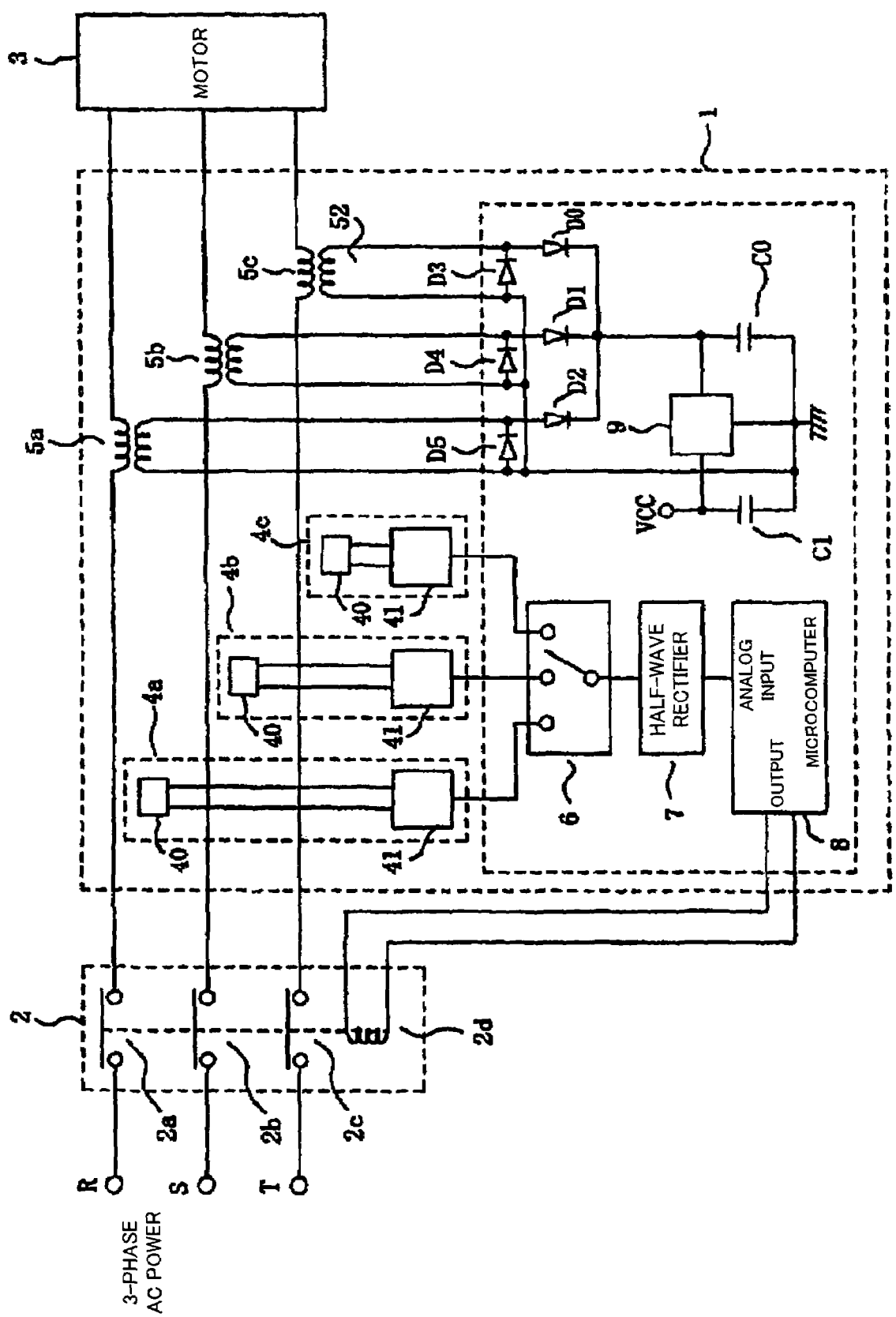
FIG. 1 is a block diagram showing the first embodiment of the present invention.

FIG. 1 shows the configuration of the system showing an embodiment of the present invention.

Reference characters R, S, and T denote power supply lines connected to a 3-phase AC power source not shown in the attached drawings, and are connected to a motor 3 through a 3-phase contactor (switch) 2 and three power supply transformers 5a, 5b, and 5c. Current detectors 4a, 4b, and 4c are arranged for each phase between the 3-phase contactor 2 and the three power supply transformers 5a, 5b, and 5c. The contactor 2 includes contact points 2a, 2b, and 2c each of which is coupled to the motor 3 through the primary winding of respective power supply transformers 5a, 5b, and 5c by the different power supply lines. The set of contact points is mechanically coupled for simultaneous operation by an electromagnetic coil 2d. The electromagnetic coil 2d is connected to the digital output of a microcomputer 8. A control circuit including the microcomputer 8, the current detectors 4a, 4b, and 4c, the power supply transformers 5a, 5b, and 5c, etc. form an electronic overload relay 1.

The output of the current detectors 4a, 4b, and 4c is sequentially switched through a switch 6. The output of the current detectors 4a, 4b, and 4c selected by the switch 6 is connected to the analog input of the microcomputer 8 through a half-wave rectifier 7

The control power source is connected to a first capacitor C0 through rectifier diodes D0, D1, and D2 from the secondary winding of the power supply transformers 5a, 5b, and 5c, and is then formed. The first capacitor C0 is connected between the positive input of a voltage adjuster 9 and the ground, and a second (stabilizing) capacitor C1 is connected between the positive output of the voltage adjuster 9 and the ground so that a voltage Vcc at a constant level can be provided as a control power source from the voltage adjuster 9. Reference numerals D3, D4, and D5 denote protective diodes.

The practical configuration of the current detectors 4a, 4b, and 4c configured by a current detection element 40 and a detection circuit 41 is described below by referring to FIGS. 2 and 3. Since the configurations of the current detectors 4a, 4b, and 4c are the same, one of them is described below as a representative configuration.

Figure 2:
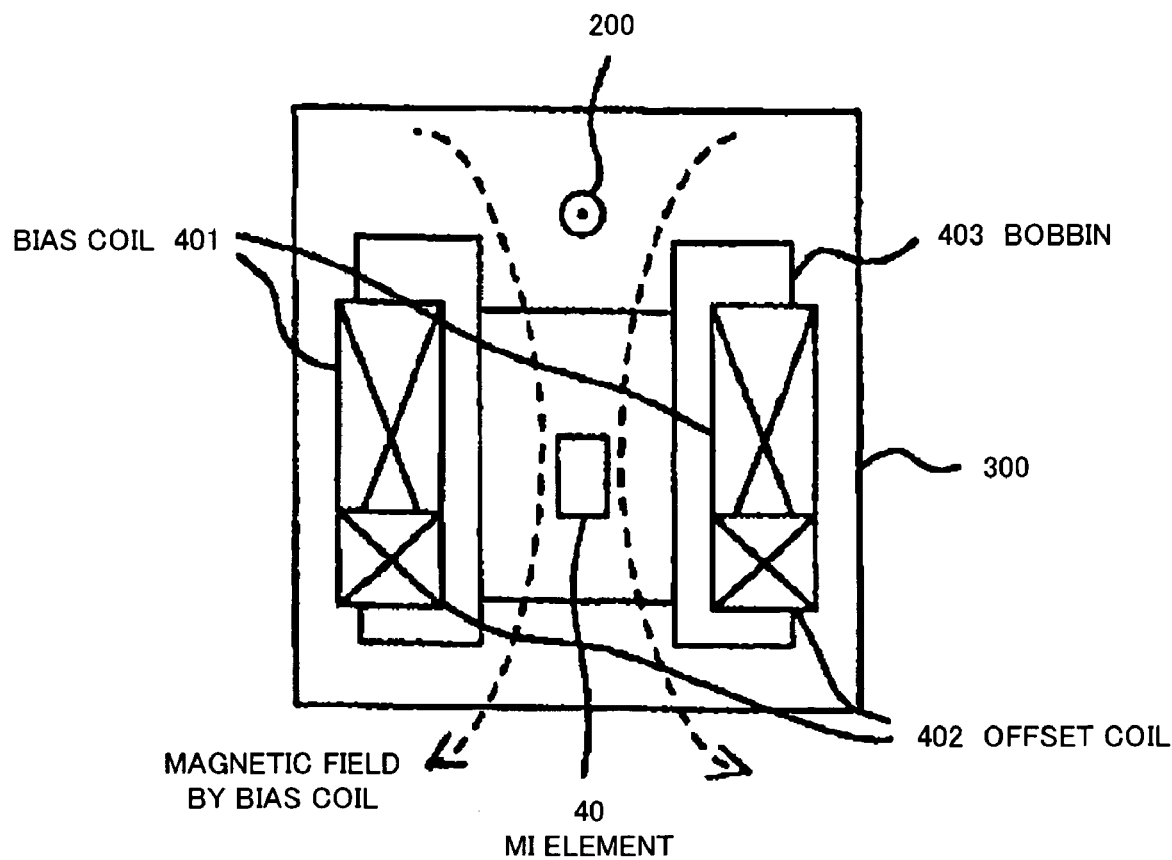
FIG. 2 is a plan view of an example of the configuration of the MI element unit shown in FIG. 1.

In FIG. 2, a magnetic impedance element (MI) element 40 has a magnetic impedance effect, and wiring 200 leads a current of a certain phase. Reference numeral 401 denotes a bias coil, reference numeral 402 denotes an offset coil, and reference numeral 403 denotes a bobbin. The MI element 40 can be, for example, an amorphous wire as disclosed by Japanese Patent Application Laid-open No. Hei 6-281712, or a thin film as disclosed by Japanese Patent Application Laid-open No. Hei 8-330645.

Figure 3:
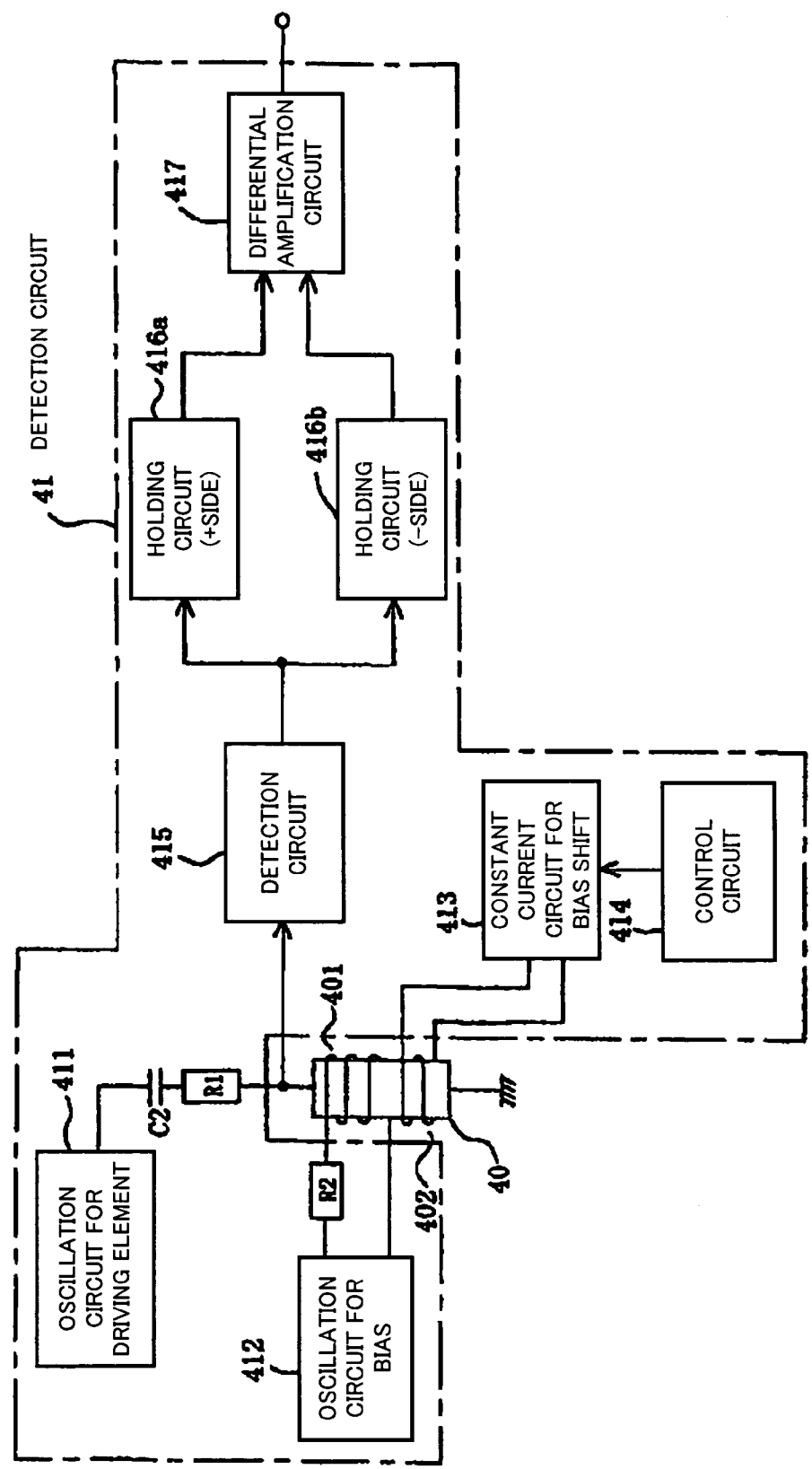
FIG. 3 is a block diagram showing an example of a detection circuit shown in FIG. 1.

FIG. 3 shows an example of a detection circuit.

In FIG. 3, an oscillation circuit 411 applies a high frequency current to the MI element 40, an oscillation circuit (or a constant current circuit) 412 drives the bias coil 401, a constant current circuit (for bias shift) 413 drives the offset coil 402, a control circuit 414 controls the presence/absence, etc. of an offset for a bias, reference numerals R1 and R2 denote resistors, reference numeral C2 denotes a capacitor, thereby forming a drive unit.

On the other hand, the detection unit is configured by a detection circuit 415, holding circuits 416a and 416b, a differential amplification circuit 417, etc.

With the above-mentioned configuration, the oscillation circuit 412 drives the bias coil 401, the constant current circuit 413 drives the offset coil 402, and the oscillation circuit 411 applies a high frequency current to the MI element 40, thereby changing the impedance of the MI element 40. The change is detected by the detection circuit 415 in the detection circuit 41, the holding circuits 416a and 416b respectively hold the plus (+) side and the minus (−) side of a detected wave, and the difference is detected by the differential amplification circuit 417.

Figure 4:
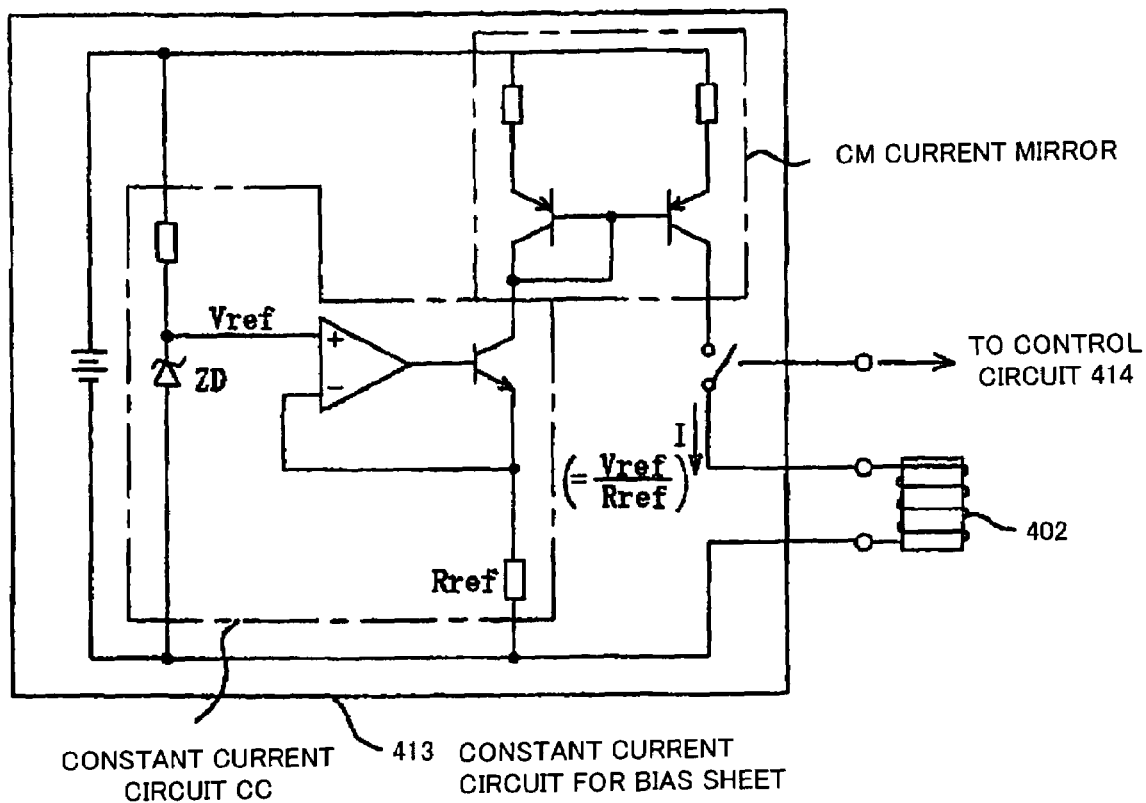
FIG. 4 shows the circuit of a practical example of the constant current circuit shown in FIG. 3.

As shown in FIG. 4, the constant current circuit for driving an offset coil is configured by, for example, a constant current circuit CC and a current mirror CM. When the reference voltage of a constant voltage diode ZD is represented by Vref, and the resistance value is represented by Rref, the current I applied to the offset coil 402 is obtained by the following equation.

$$I = Vref/Rref$$

Figure 5:
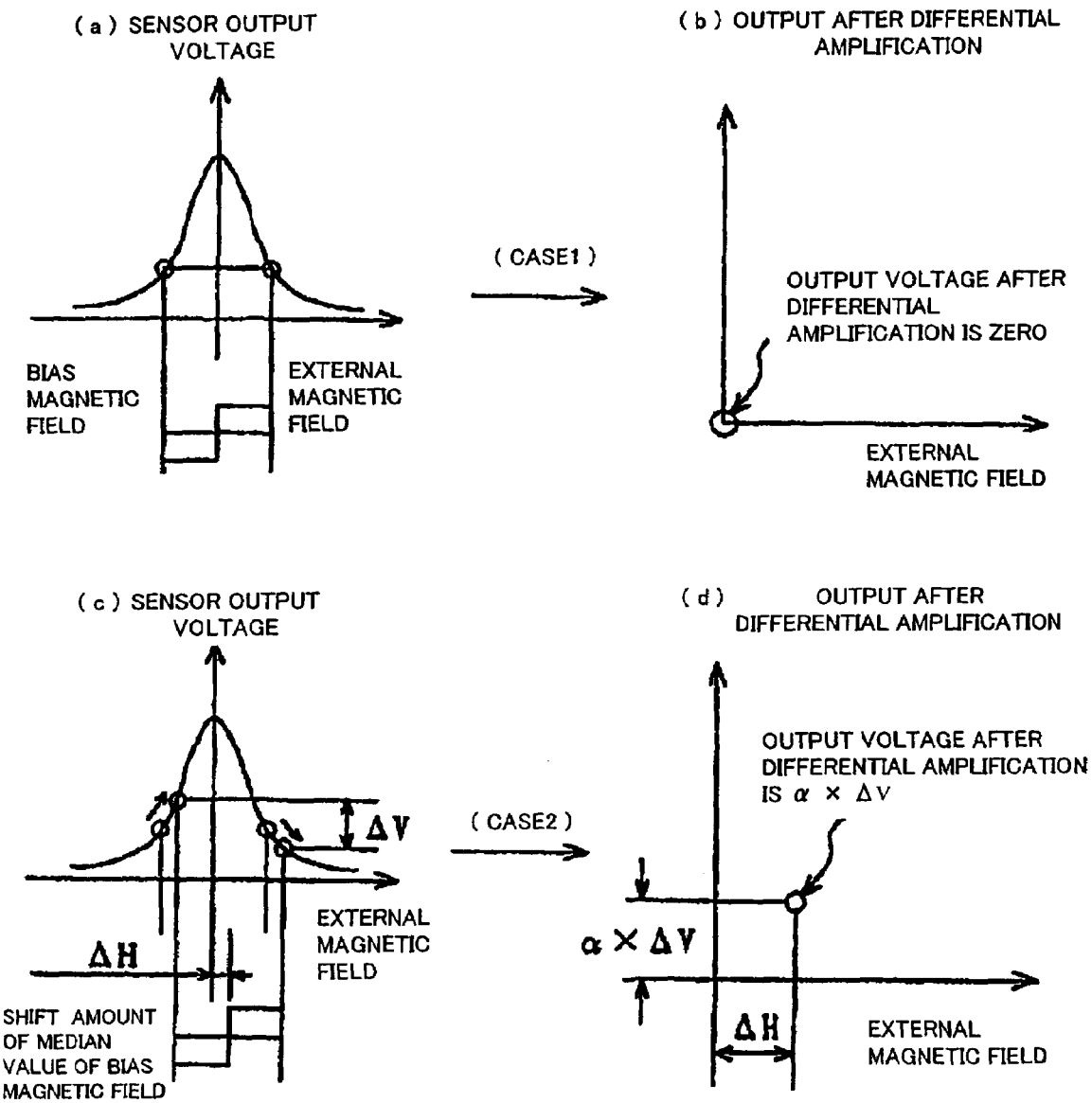
FIG. 5 shows the method for detecting the output sensitivity of an MI element.

FIG. 5 shows the method for detecting the output sensitivity in the MI element 40 in which an external magnetic field is zero, and an AC bias is applied.

In the case 1 shown in (a) and (b) in FIG. 5, the median value of the bias magnetic field is a magnetic field of zero, and the output of the holding circuits 416a and 416b is equal to each other, and the output of the differential amplification circuit 417 is zero.

In the case 2 shown in (c) and (d) in FIG. 5, the median value of the bias magnetic field is shifted by $\Delta H$. As a result, the output difference between the holding circuits 416a and 416b is $\Delta V$, and the output of the differential amplification circuit 417 is $\alpha \times \Delta V$ ($\alpha$ indicates a gain of the differential amplification circuit). Therefore, the sensitivity of the magnetic sensor (MI element) can be represented by $\Delta V/\Delta H$.

This indicates that the detection sensitivity of the magnetic sensor (MI element) can be automatically detected by obtaining the output voltage by changing the median value of the bias magnetic field by the known value for the magnetic field. Therefore, although the detection sensitivity of the sensor changes by an environmental variance, a change with time, etc., the detection sensitivity of a sensor can be obtained by the method shown in FIG. 5, and a correction can be automatically made.

The external magnetic field is zero in the description above. However, when an arbitrary magnetic field is applied, the detection sensitivity of the magnetic sensor obtained when the median value of the bias magnetic field is changed by the known value for the magnetic field remains unchanged as compared with the detection sensitivity shown in FIG. 5 only by an offset for the applied magnetic field. Although the AC bias is applied in the above-mentioned case, the detection sensitivity of a sensor can also be automatically detected and corrected by applying a DC bias.

Figure 6:
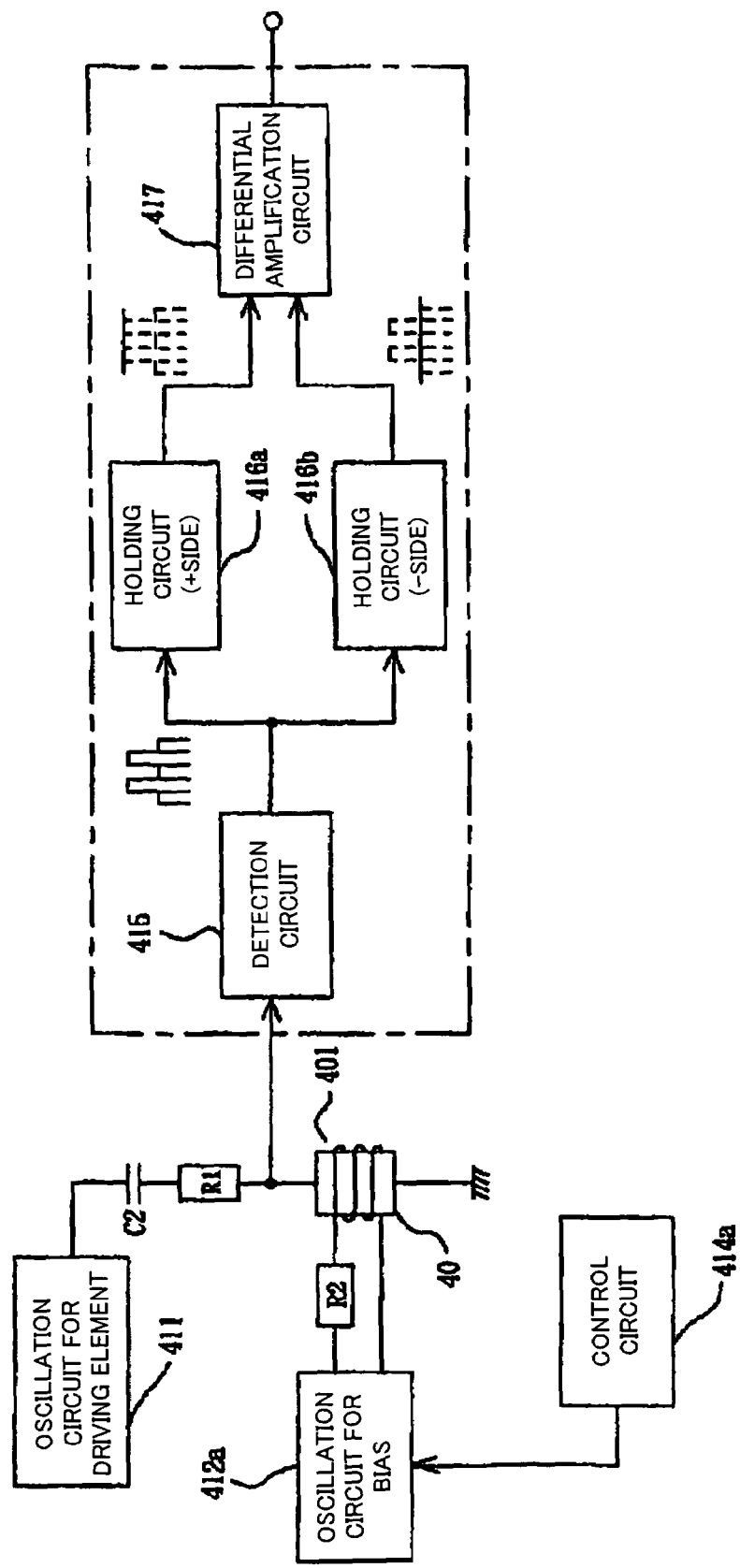
FIG. 6 is a block diagram showing another example of a detection circuit.

FIG. 6 shows another example of the detection circuit.

Figure 7:
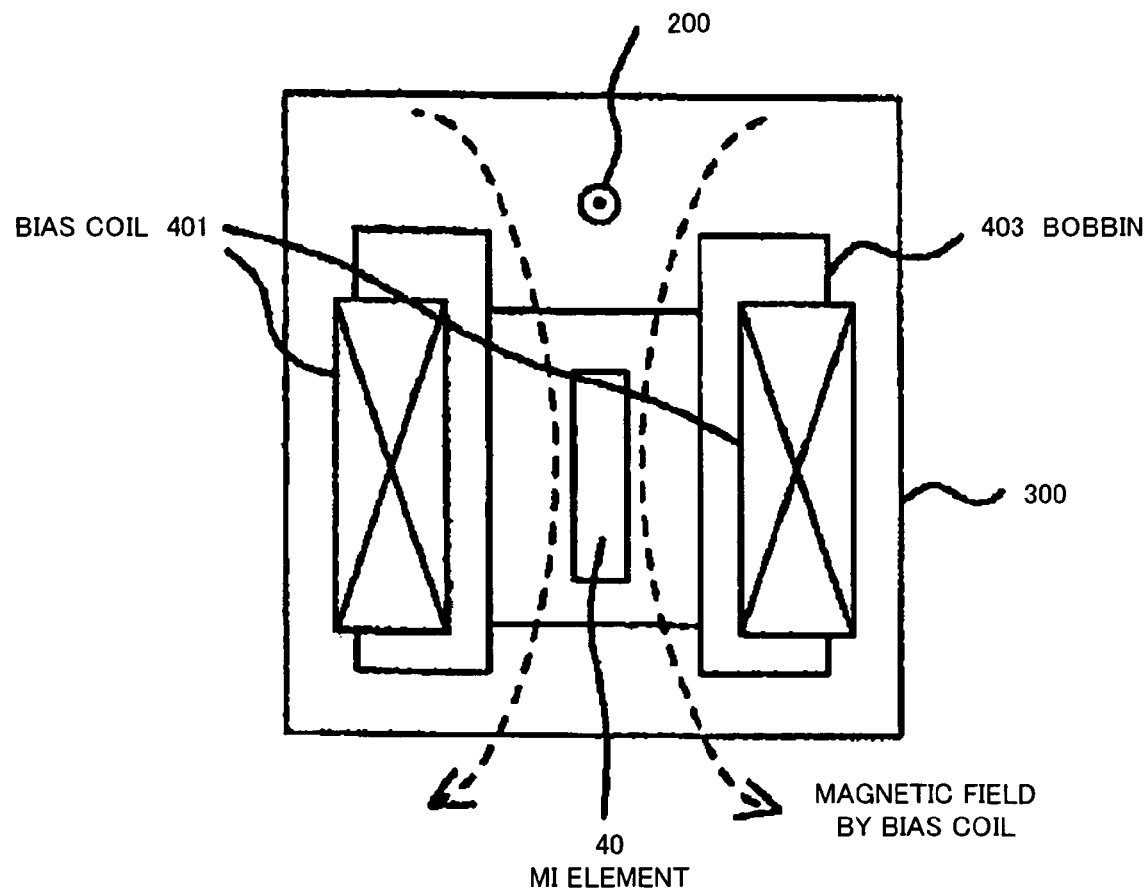
FIG. 7 is a plan view showing another example of the configuration of an MI element unit.

In FIGS. 2 and 3, an offset coil is used to apply an offset magnetic field for changing the median value of the bias magnetic field. This example is characterized in that the direct current of the oscillation pulse for driving the bias coil is changed. The constant current circuit for bias shift is omitted in and after FIG. 6, and the offset coil shown in FIG. 2 is omitted in the magnetic sensor in and after FIG. 7.

Figure 8:
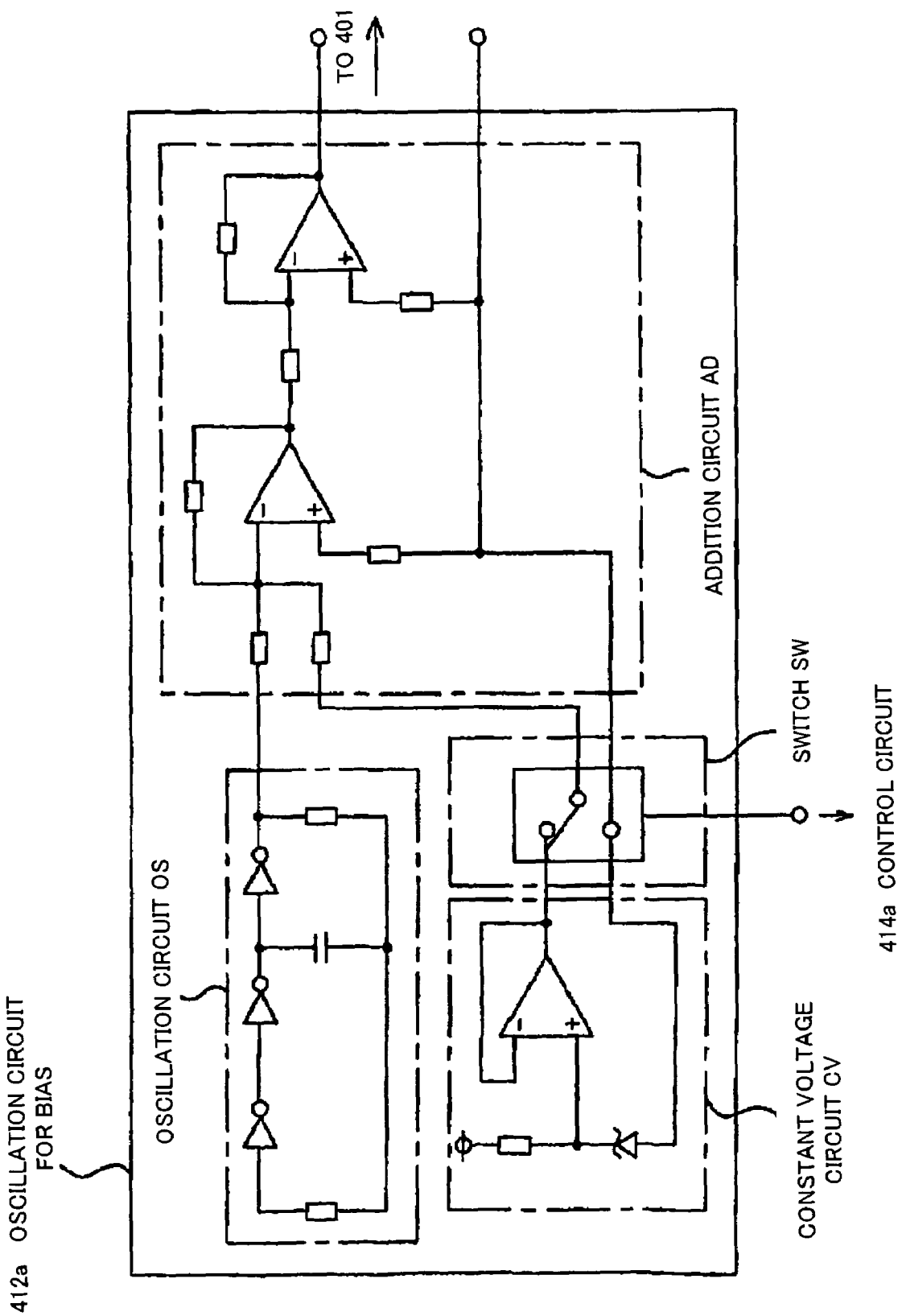
FIG. 8 shows the circuit of a practical example of the oscillation circuit for bias shown in FIG. 6.

Therefore, as shown in FIG. 8 for example, the oscillation circuit for bias 412a shown in FIG. 6 is configured by an oscillation circuit OS of several tens KHz, a constant voltage circuit CV, a switch SW, and an addition circuit AD. Since a switch SW is normally grounded at the potential of zero, the pulse from the oscillation circuit OS and the offset voltage from the constant voltage circuit CV is added in the addition circuit AD when the switch SW is connected to the constant voltage circuit CV by a control circuit 414a although the offset amount from the oscillation circuit OS is zero. As a result, the offset magnetic field which changes the median value of the bias magnetic field is applied.

Since the automatic detection and correction of the detection sensitivity of a sensor is performed similarly as in the case shown in FIGS. 2 and 3, the explanation is omitted here.

The system using one MI element is described above, but there can be two or more MI elements as described below. In the explanation below, a bias coil, etc. is omitted, but it is obvious that the bias coil, etc. can be used.

Figure 9:
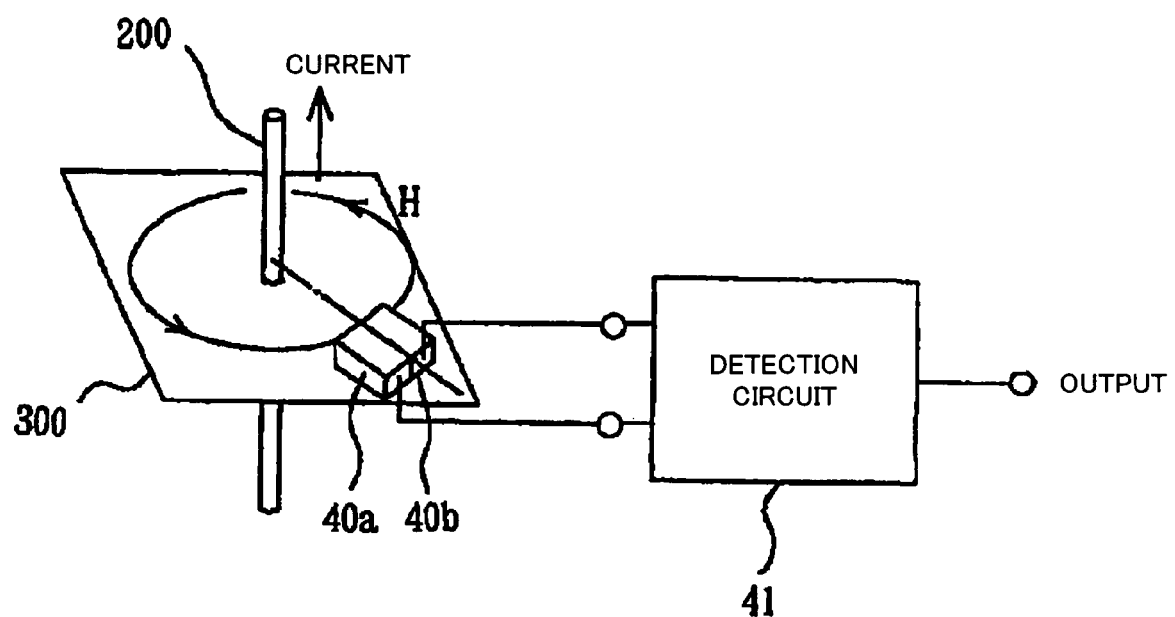
FIG. 9 is an oblique view of an example of another configuration of an MI element unit.

FIG. 9 shows an example of arranging two MI elements. Reference numerals 40a and 40b shown in FIG. 9 denote MI elements. Reference numeral 200 denotes wiring for leading a current of a certain phase. Reference numeral 300 denotes a substrate for fixing the wiring 200 and the MI elements 40a and 40b. The reference numeral 41 denotes a detection circuit.

Figure 10:
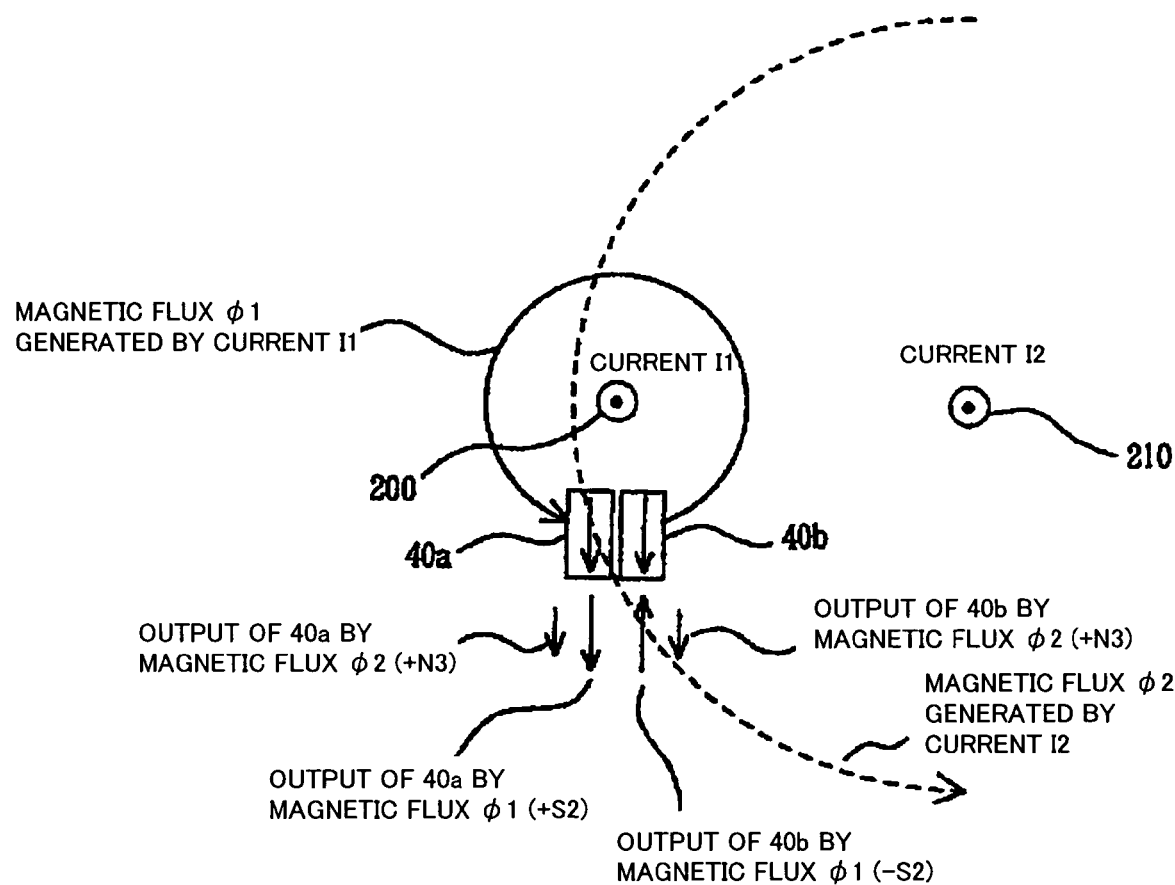
FIG. 10 is an explanatory view showing the influence of a current flowing through the adjacent wiring shown in FIG. 9.

FIG. 10 is an explanatory view of the influence of the current flowing through adjacent wiring with the configuration shown in FIG. 9, and shows the case in which a current I1 and another current I2 flow adjacent to each other. Assuming that the magnetic flux generated by the currents I1 and I2 are represented by $\phi 1$ and $\phi 2$ respectively, and the output levels appearing on the two MI elements by $\phi 1$ and $\phi 2$ are S2 and N3 respectively, the output of the difference between the two MI elements 40a and 40b is calculated as follows.

$$\text{differential output} = \text{output of } 40a - \text{output of } 40b \qquad (1)$$
$$= S2 + N3 - (-S2 + N3)$$
$$= 2 \times S2$$

thus enabling the detection of the current I1 without the influence of the current I2 of adjacent wiring 210. Furthermore, when a uniform external magnetic field is applied as noise, the output of equal size and sign appears on the two MI elements. Therefore, the influence of the external magnetic field can be canceled as in the case of the adjacent wiring.

Figure 11:
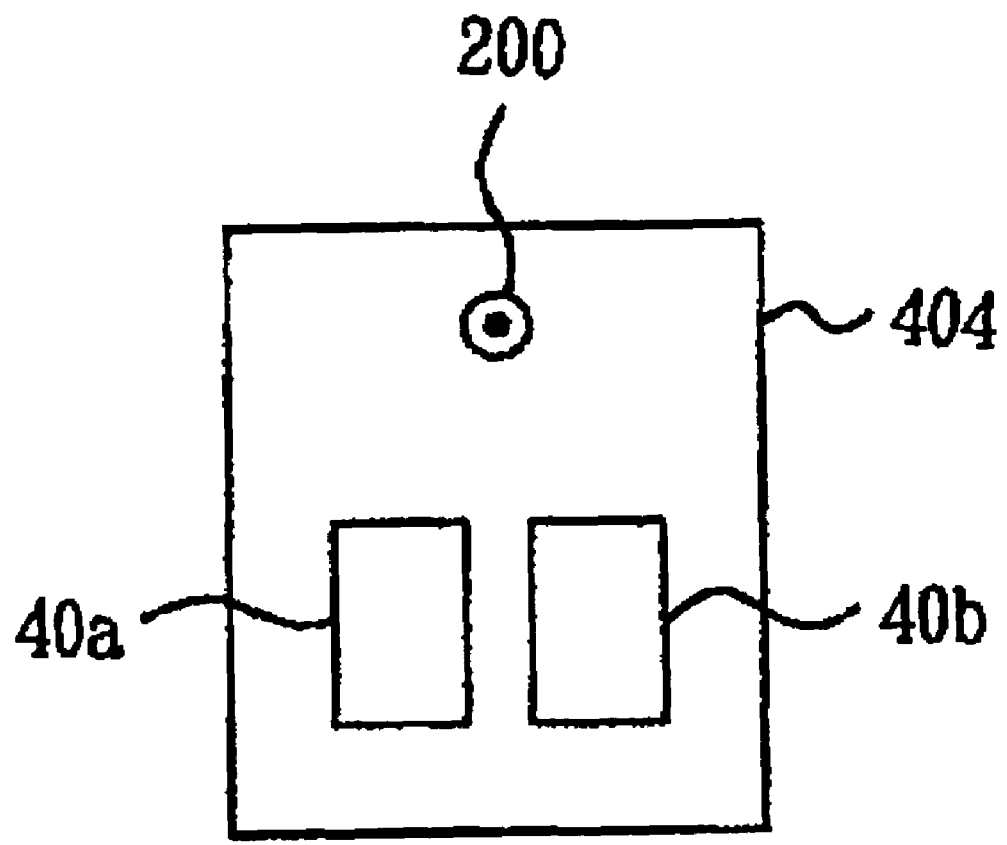
FIG. 11 is a plan view showing an example of the configuration of the magnetic shield of an MI element unit.

FIG. 11 shows the configuration of another example of removing the influence of a current flowing through adjacent wiring In this example, as compared with that shown in FIG. 11, a shield plate 404 is added as a magnetic shield using Permalloy, etc. That is, as shown in FIGS. 9 and 10, the influence of a current flowing through adjacent wiring can be logically canceled, but the noise of an external magnetic field cannot be completely canceled due to the variance in sensitivity between the two MI elements, the influence of the displacements, etc. Therefore, the influence can be reduced by the magnetic shield.

Figure 12:
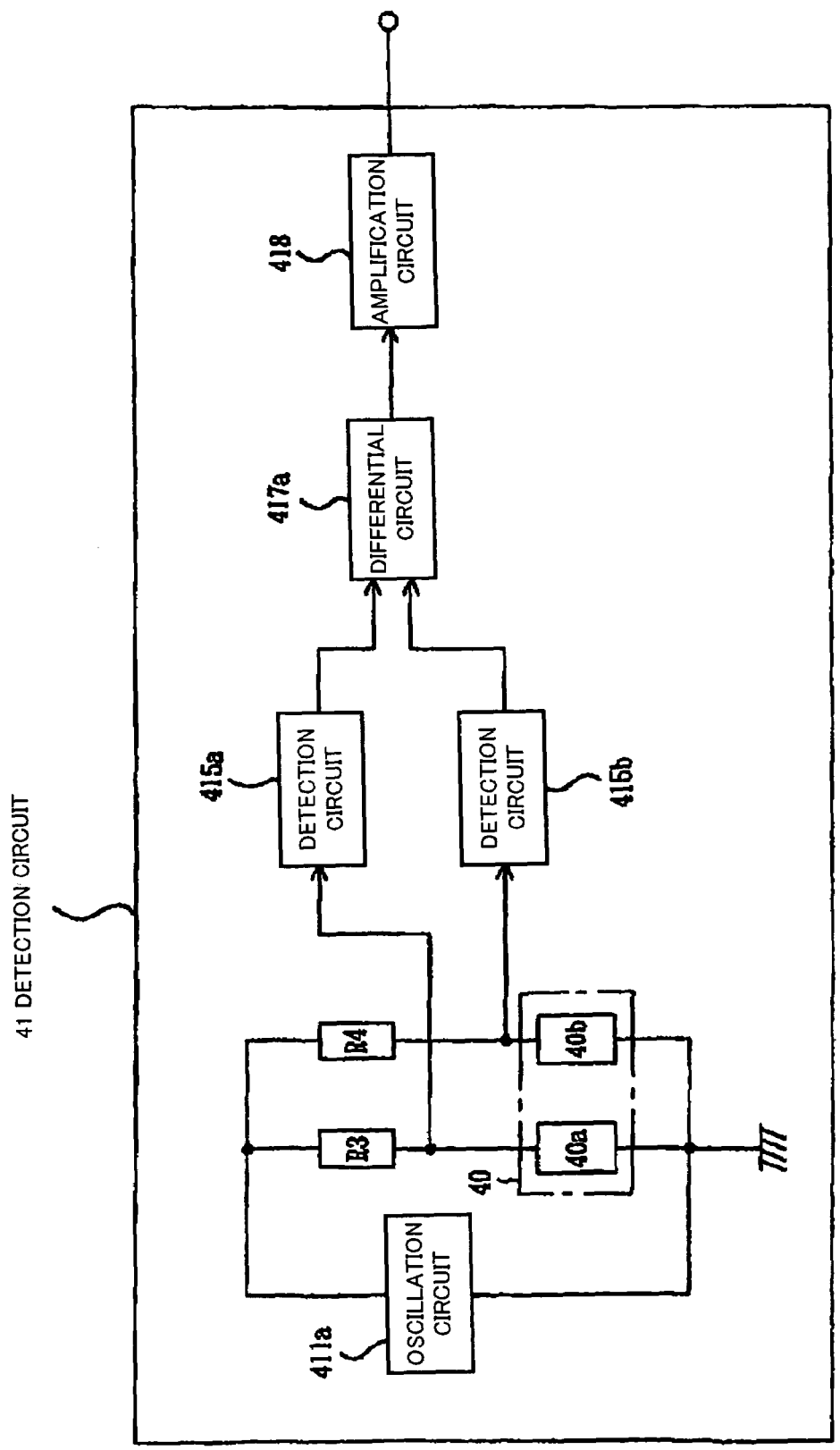
FIG. 12 is a block diagram showing another example of a detection circuit.

FIG. 12 shows another example of a detection circuit.

The detection circuit 41 applies a high frequency current to the MI elements 40a and 40b using an oscillation circuit 411a, and the partial pressure resistors R3 and R4, detects a change in impedance by the magnetic field of the MI elements 40a and 40b as a change in voltage using detection circuits 415a and 415b, generates the output proportional to the difference between the MI elements 40a and 40b using a differential circuit 417a, and retrieves the output using an amplification circuit 418. The differential circuit 417a can be replaced with an addition circuit, and the output proportional to the difference between the MI elements 40a and 40b can be replaced with the output proportional to the sum of the MI elements 40a and 40b.

In the above-mentioned example, the magnetic field detection directions are the same between the two MI elements. However, it is obvious that a current can be detected without the influence of the disturbance noise as in the above-mentioned example by obtaining a sum of the output of the two MI elements with the magnetic field detection directions set opposite each other.

Figure 13:
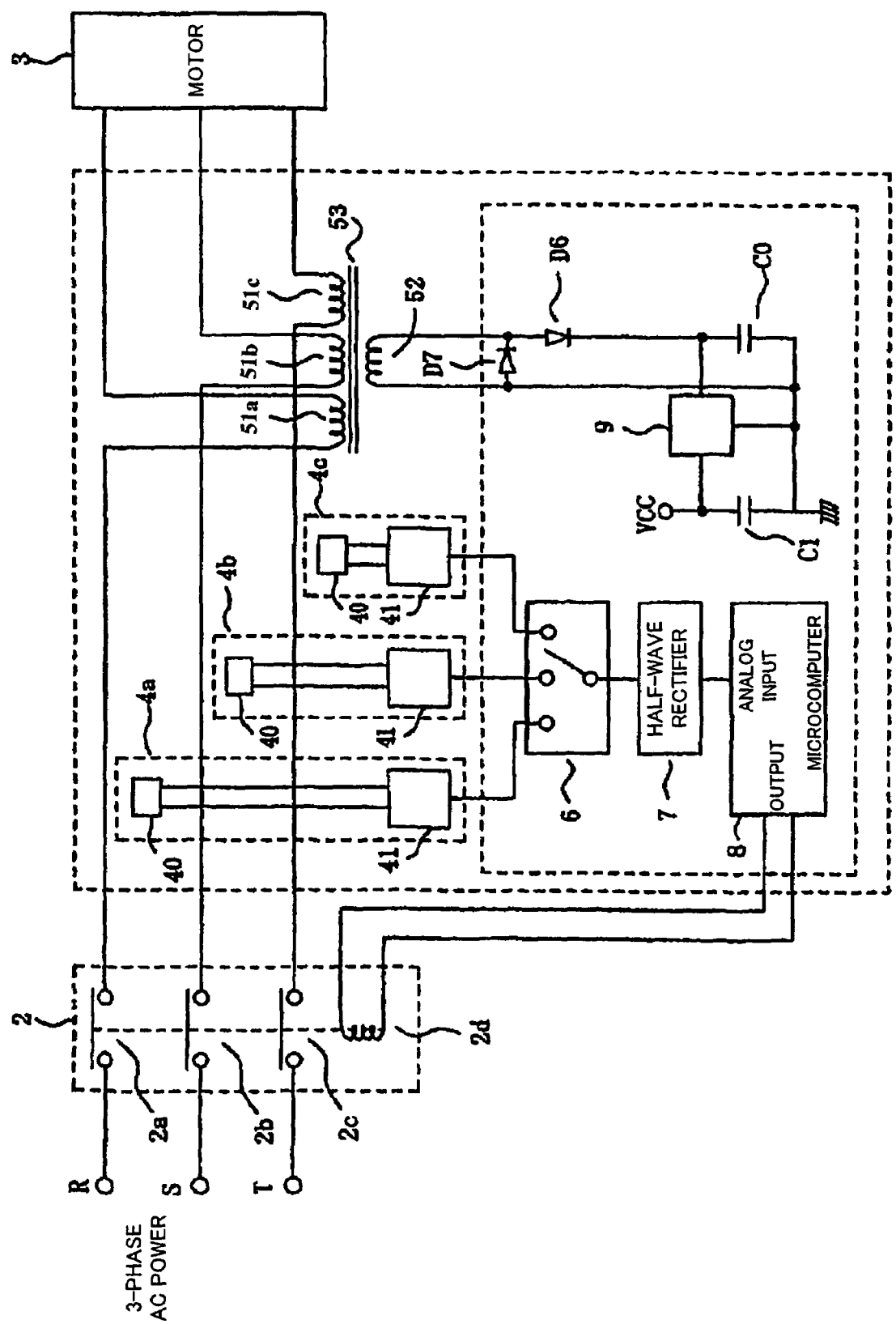
FIG. 13 is a block diagram showing the second embodiment of the present invention.

FIG. 13 shows another embodiment of the present invention.

In FIG. 1, the power supply transformer is provided for each phase. However, in FIG. 13, one core 53 is provided with primary winding 51a, 51b, and 51c for each phase, and power is applied from secondary winding 52 through the diode D6. Reference numeral D7 denotes a protective diode.

Figure 14:
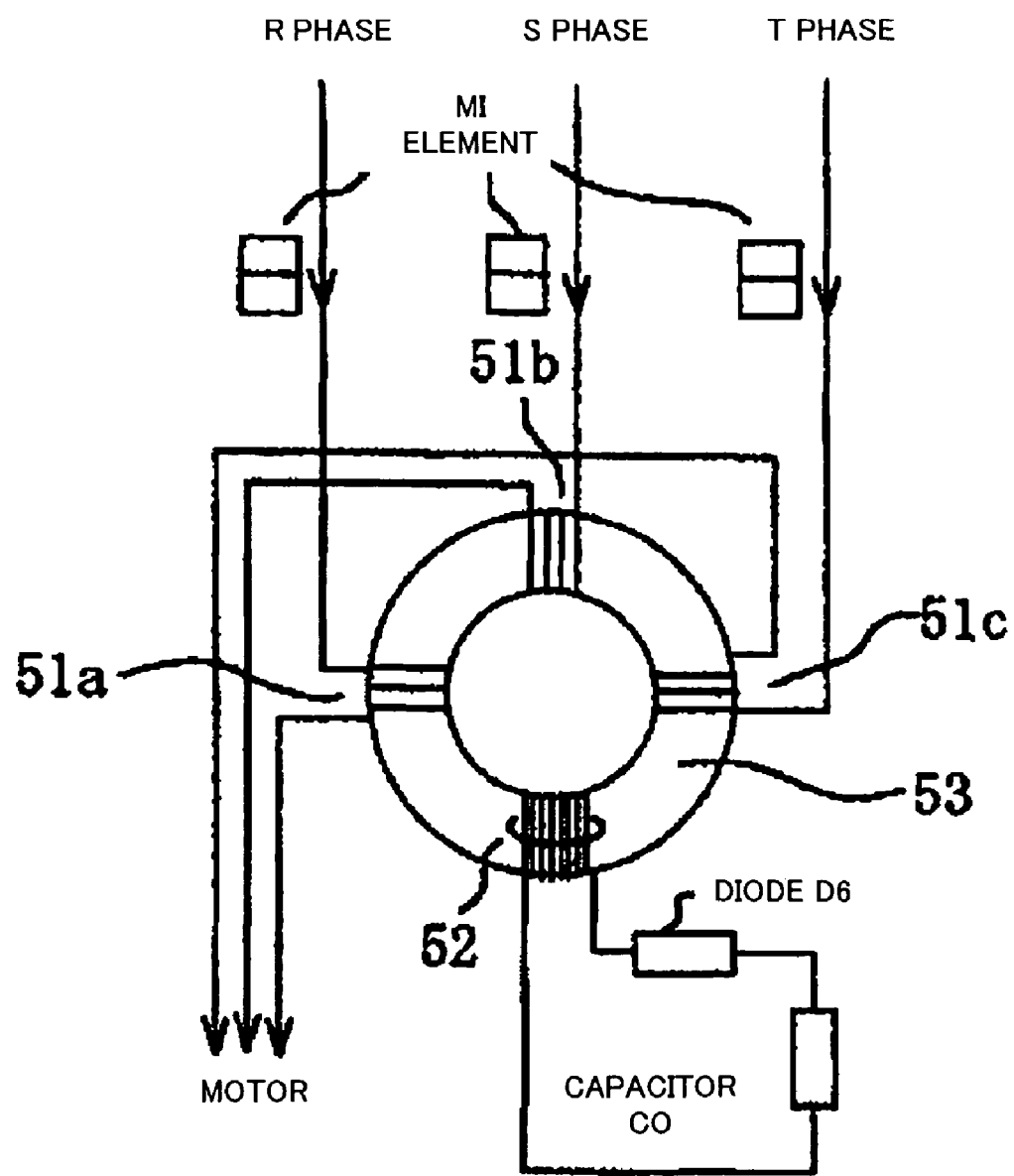
FIG. 14 shows the configuration of another example of a control power source unit.

FIG. 14 shows an example of using a toroidal core. In this case, the rate of turns of the primary winding 51a, 51b, and 51c is selected such that an appropriate current level can be provided from the secondary winding 52. That is, since no magnetic flux can be generated when the turns of the primary winding is equally set and balanced, the turns are set different from each other.

The 3-phase alternating current is applied in the above-mentioned example. However, it is obvious that the single-phase alternating current can also be appropriately used by considering that it corresponds to one phase of the 3-phase alternating current.

INDUSTRIAL APPLICABILITY

According to the present invention, the following advantages can be achieved.

1) Since a magnetic detection element having a magnetic impedance effect is used, the magnetic saturation by a iron core caused by a widely used current detection transformer does not occur, thereby widening the current detection range.

2) Using a magnetic impedance element, changing the median value of the bias magnetic field by a known amount of magnetic field, and detecting the output voltage enable the sensitivity of a sensor to be automatically detected. As a result, a correction can be automatically made with the detection sensitivity of a sensor changed by an environmental characteristic and a change with time. Therefore, a high precision device can be provided without degradation in precision by an environmental characteristic and a change with time.

3) Since it is not necessary to externally provide a control power source, the device can be appropriately used as a general-purpose device at a reduced total cost.

4) When a control power source is used with a multiphase AC power source, it is not necessary to provide the power supply transformer for each phase, that is, at least one power supply transformer can be provided. Therefore, the number of necessary units can be smaller, and the entire cost can be reduced.

5) If the absolute value of the output of the magnetic detection element can be the same as the value of the magnetic flux generated by the current, and the difference between two elements can be detected in the positions in which the opposite polarity can be detected, then the influence of the magnetic field by an external magnetic field and a current flowing through the adjacent wiring can be eliminated, and a device excellent in environmental resistance can be provided.

The invention claimed is:

1. An overload current protection device which cuts off the supply of current to a load when an overcurrent occurs, comprising:
a switch for supplying or cutting off the current from a power source to the load;
a current detector for detecting the current; and
a control power source for applying power to each unit of the device,
wherein the current detector is configured by a magnetic impedance element having a magnetic impedance effect, and magnetic flux generated by the current is detected using the magnetic impedance element, the overload current protection device further comprising:
a current applying unit applying a high frequency current to the magnetic impedance element;
a detection unit detecting an output of the magnetic impedance element;
a correction unit correcting a detection result;
a magnetic field applying unit applying a bias magnetic field to the magnetic impedance element;
a magnetic field variable unit changing a median value of the bias magnetic field; and
a control unit controlling a change of the median value, wherein the median value of the bias magnetic field is changed, the output of the magnetic impedance element is detected, and the output is corrected depending on the detection result.

2. An overload current protection device which cuts off the supply of current to a load when an overcurrent occurs, comprising:
a switch for supplying or cutting off a multiphase current from a power source to a load;
a plurality of current detectors for detecting the multiphase current for each phase; and
a control power source for applying power to each unit of the device,
wherein each of the plurality of current detectors is configured by a magnetic impedance element having a magnetic impedance effect, and magnetic flux generated by the current is detected using the magnetic impedance element, the overload current protection device further comprising:
a current applying unit applying a high frequency current to the magnetic impedance element;
a detection unit detecting an output of the magnetic impedance element;
a correction unit correcting a detection result;
a magnetic field applying unit applying a bias magnetic field to the magnetic impedance element;
a magnetic field variable unit changing a median value of the bias magnetic field; and
a control unit controlling a change of the median value, wherein the median value of the bias magnetic field is changed, the output of the magnetic impedance is detected, and the output is corrected depending on the detection result.

3. An overload current protection device which cuts off a supply of current to a load when an overcurrent occurs, comprising:
a switch for supplying or cutting off the current from a power source to the load;
a current detector for detecting the current; and
a control power source for applying power to each unit of the device,
wherein the current detector is configured by a magnetic impedance element having a magnetic impedance effect, and magnetic flux generated by the current is detected using the magnetic impedance element,
wiring for conducting the current and a substrate for fixing the wiring are provided, and the magnetic impedance element is arranged near the wiring on the substrate so that the magnetic flux generated by the current can be directly detected by the magnetic impedance element, the overload current protection device further comprising:

a current applying unit applying a high frequency current to the magnetic impedance element;

a detection unit detecting an output of the magnetic impedance element;

a correction unit correcting a detection result;

a magnetic field applying unit applying a bias magnetic field to the magnetic impedance element;

a magnetic field variable unit changing a median value of the bias magnetic field; and a control unit controlling a change of the median value, wherein the median value of the bias magnetic field is changed, the output of the magnetic impedance element is detected, and the output is corrected depending on a detection result.

4. The device according to claim 3, wherein the magnetic field applying unit is configured by a bias coil and an oscillation unit.

5. The device according to claim 4, wherein the magnetic field variable unit is configured by an offset coil and a constant current generation unit.

6. The device according to claim 4, wherein the magnetic field variable unit is configured by a constant current generation unit, a switch unit, and an addition unit, and a constant voltage is applied to the bias coil.

7. The device according to claim 3, wherein the magnetic field variable unit is configured by an offset coil and a constant current generation unit.

8. The device according to claim 3, wherein the magnetic field variable unit is configured by a constant current generation unit, a switch unit, and an addition unit, and a constant voltage is applied to the bias coil.

* * * * *